United States Patent [19]

Reinagel

[11] Patent Number: 4,808,854

[45] Date of Patent: Feb. 28, 1989

[54] TRINARY INVERTER

[75] Inventor: Frederick G. Reinagel, Buffalo, N.Y.

[73] Assignee: LTV Aerospace & Defense Co., Buffalo, N.Y.

[21] Appl. No.: 21,976

[22] Filed: Mar. 5, 1987

[51] Int. Cl.$^4$ .................. H03K 17/66; H03K 17/13; H03K 17/687; H03K 19/094

[52] U.S. Cl. .................. 307/473; 307/448; 307/451; 307/576; 307/579; 307/585

[58] Field of Search ............ 307/473, 475, 451, 448, 307/576, 579, 583, 584, 585, 481, 479, 270

[56] References Cited

U.S. PATENT DOCUMENTS

| | | | |
|---|---|---|---|
| 3,060,330 | 10/1962 | Trampel | 307/473 |
| 3,129,340 | 4/1964 | Baskin | 307/473 |
| 3,207,922 | 9/1965 | Gruodis et al. | 307/473 |
| 3,671,764 | 6/1972 | Maley et al. | 307/473 |
| 3,949,242 | 4/1976 | Hirasawa et al. | 307/270 X |
| 4,435,658 | 3/1984 | Murray et al. | 307/473 X |
| 4,449,065 | 5/1984 | Davies, Jr. | 307/473 |
| 4,468,574 | 8/1984 | Engeler et al. | 307/450 X |
| 4,574,273 | 3/1986 | Atsumi et al. | 307/451 X |
| 4,596,940 | 6/1986 | Schuppan et al. | 307/473 X |
| 4,709,173 | 11/1987 | Nishimichi et al. | 307/473 X |

Primary Examiner—Stanley D. Miller
Assistant Examiner—David R. Bertelson
Attorney, Agent, or Firm—Brooks & Kushman

[57] ABSTRACT

A trinary inverter for a digital logic circuit of the type having relatively positive, negative and zero signal voltage values is implemented with CMOS transistors and has the advantages of low power dissipation and low output impedance in the zero signal state. The inverter comprises first, second and third inverter branches, where each branch is formed of a pair of complementary MOS field effect transistors. The inverted output signals from each branch are used to produce a device output signal having the desired voltage transfer characteristics.

7 Claims, 2 Drawing Sheets

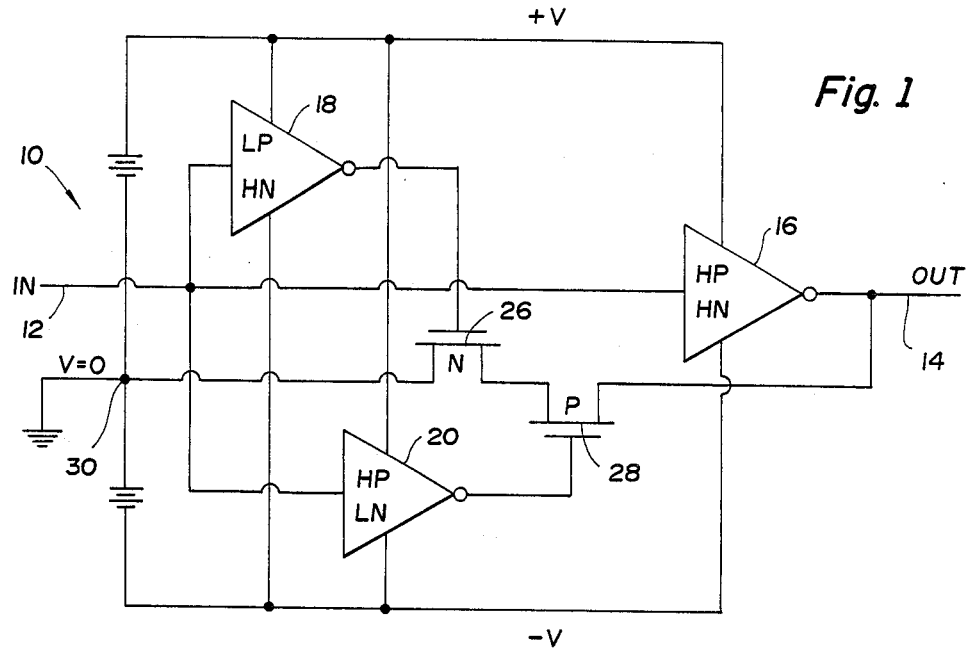
*Fig. 1*
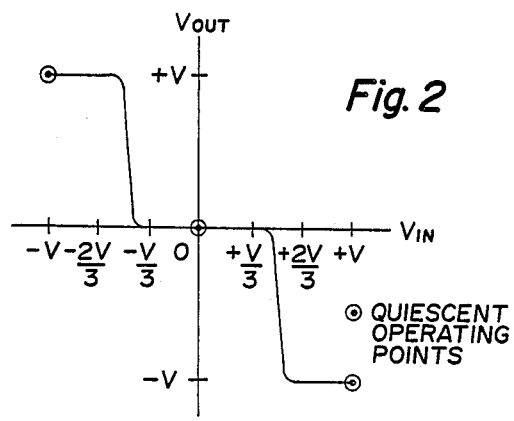
*Fig. 2*
*Fig. 3*
| IN | − | 0 | + |
|---|---|---|---|
| OUT | + | 0 | − |

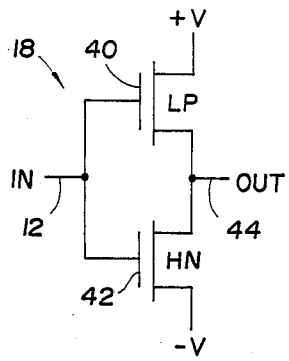
Fig. 5A
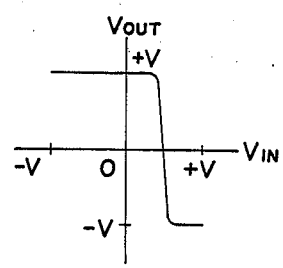
Fig. 5B
Fig. 5C
| IN | − | 0 | + |
|---|---|---|---|
| OUT | + | + | − |
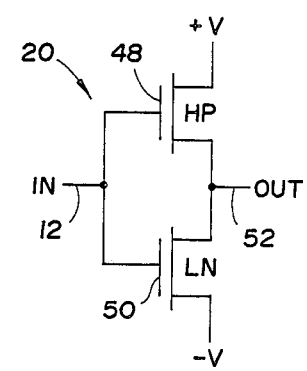
Fig. 6A
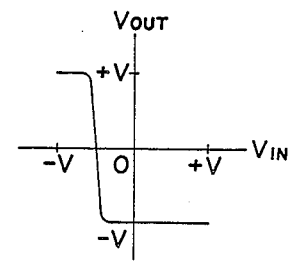
Fig. 6B
Fig. 6C
| IN | − | 0 | + |
|---|---|---|---|
| OUT | + | − | − |
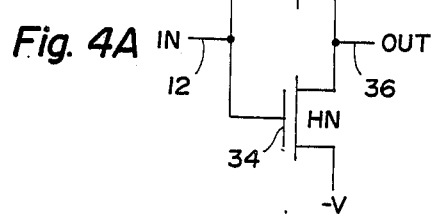
Fig. 4A
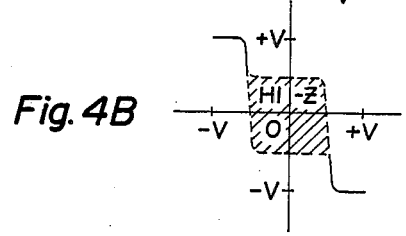
Fig. 4B
Fig. 4C
| IN | − | 0 | + |
|---|---|---|---|
| OUT | + | HI-Z | − |

4,808,854

1

TRINARY INVERTER

TECHNICAL FIELD

This invention relates to an inverter for use in a trinary logic circuit.

BACKGROUND ART

A trinary logic circuit uses signals having relatively positive, negative and zero voltage values. An inverter is a basic device for converting a positive signal to a negative signal and vice versa.

One consideration in the design of a trinary inverter is the power dissipation of the device when in its quiescent states. Power dissipation is a factor in the design of logic circuits, and is reflected in elevated operating temperatures which can adversely affect circuit performance.

Another consideration is the output impedance of the device in the zero voltage state. High device impedances associated with some types of inverters may be undesirable depending on the circuit application, e.g., for trinary arithmetic or logic.

Of possible relevance are the following United States patent references.

The patent to Davies, Jr., U.S. Pat. No. 4,449,065, discloses an input buffer configured of transistors for applying three levels of test signals for testing associated circuitry.

The patent to Engeler et al, U.S. Pat. No. 4,468,574, discloses a binary inverter and other types of logic devices configured of CMOS transistors.

The patent to Trampel, U.S. Pat. No. 3,060,330, discloses a three-level inverter circuit implemented with bipolar transistors.

Other United States patents disclosing tri-level circuits are: U.S. Pat. Nos. 3,129,340; 3,155,845; 3,207,922; 3,671,764 and 3,949,242.

DISCLOSURE OF THE INVENTION

The present invention is a trinary inverter which uses CMOS transistors to obtain inversion of a logic signal. The invention is characterized by relatively low power dissipation in its three quiescent states and low output impedance when the input signal is at the midpoint, i.e. zero level.

The trinary inverter is realized by use of first, second and third cooperative inverter branches configured of CMOS field effect transistors. Four distinct types of MOS transistors are used: (i) low-threshold, N-channel ( "LN "); (ii) high-threshold, N-channel ( "HN "); (iii) low-threshold, P-channel ( "LP "); and (iv) high-threshold, P-channel ( "HP "). The inverter branches configured of these CMOS transistors yield voltage characteristics which are combined cooperatively through transistor switches to result in a device transfer function and impedance level of desired characteristics.

Other advantages and features of the invention will be made apparent in connection with the following detailed description.

BRIEF DESCRIPTION OF THE DRAWINGS

FIG. 1 is a schematic view of a trinary inverter of the present invention;

FIG. 2 illustrates the voltage transfer function for the trinary inverter of FIG. 1;

FIG. 3 is a truth table comparing input signal values to output signal values in correspondence to the voltage transfer function of the trinary inverter;

FIGS. 4A, 4B and 4C illustrate a like schematic, voltage transfer function and truth table, respectively, for the first inverter branch of the trinary inverter;

FIGS. 5A, 5B and 5C illustrate a like schematic, voltage transfer function and truth table, respectively, for the second inverter branch of the trinary inverter; and FIGS. 6A, 6B and 6C illustrate a like schematic, voltage transfer function and truth table, respectively, for the third inverter branch of the trinary inverter.

BEST MODE FOR CARRYING OUT THE INVENTION

The trinary inverter of the present invention is illustrated generally at 10 in the schematic circuit diagram of FIG. 1. The trinary inverter 10 is configured of complementary metal- oxide-semiconductor ( "CMOS") field effect transistors ("FET").

The trinary inverter receives a logic signal on input terminal 12 and inverts its value to produce the opposite logic signal on an output terminal 14. The truth table of FIG. 3 indicates the inversion which occurs between input and output with the three types of possible trinary logic signals, i.e. negative, zero and positive.

The inversion of logic signals is accomplished by the cooperation of first, second, and third inverter branches 16, 18 and 20, respectively. The second and third inverter branches 18 and 20 are responsible to produce a low-impedance midpoint, i.e. zero, signal on the output terminal 14 when the value of the input signal is between $-V/3$ to $+V/3$, where "V " is the nominal voltage level signifying a positive logic signal. The first inverter branch 16 produces a directly inverted output signal when the value of the input signal is outside of the range of $-2V/3$ to $+2V/3$. The voltage transfer function resulting from the cooperation of the first, second and third inverter branches 16, 18, 20 is illustrated in FIG. 2. This transfer function is, in turn, stated in equivalent logic symbols in the truth table of FIG. 3. An important feature of the transfer function is the less-than-unity gain which occurs at the quiescent operating points.

Each of the inverter branches 16, 18 and 20 is connected between a positive reference potential 22 at value $+V$ volts, and a negative reference potential 24 at a value $-V$ volts in a manner conventional with CMOS logic circuits. The following describes in greater detail the circuit configuration, voltage transfer function and truth table associated with each of the inverter branches 16, 18 and 20.

With reference to FIG. 4A, the circuit schematic of the first inverter branch 16 is shown. This inverter is configured of complementary P and N types of MOS transistors indicated at 32 and 34, with high threshold voltages. The inverter receives the basic input signal on terminal 12 and produces a first output signal on output terminal 36.

The voltage transfer function of the first inverter branch 16 is shown in FIG. 4B. The output signal is characterized as a direct inversion of the input signal when the input signal is outside the range of nominally $-2V/3$ to $+2V/3$. In the midpoint range of input signal the output is at a very high impedance, as indicated by the dashed lines and the notation "HI-Z ". The truth table corresponding to the voltage transfer function of the first inverter branch 16 is shown in FIG. 4C.

With reference to FIG. 5A, the circuit schematic of the second inverter branch is shown. This inverter is configured of complementary transistors 40 and 42. The transistor 40 is selected to be a low threshold voltage, P-channel type. Transistor 42 is selected to be a high threshold voltage, N-channel type. The transistor 40 should become conductive and transistor 42 non-conductive when the gate-to-source threshold voltage becomes more negative than nominally $+\frac{1}{3}$ volts. The transistor 42 should become conductive and transistor 40 non-conductive when the gate-to-source threshold voltage comes more positive than nominally $+\frac{2}{3}$ V volts.

The second inverter branch 18 receives the basic input signal to be inverted on terminal 12, and produces a second inverted output signal on output terminal 44, which serves as switching signal to be hereinafter described. The voltage transfer function for inverter branch 18 is illustrated in FIG. 5. It can be seen that the inversion of the input signal is offset by about V/2 volts, i.e. the output signal will have a transition between +V and −V when the input voltage rises through to the +V/2 level. The corresponding truth table is shown in FIG. 5C.

With reference to FIG. 6A, the circuit schematic of the third inverter branch 20 is shown. This inverter is similarly configured of a pair of complementary transistors 48 and 50. The transistor 48 is a high threshold voltage, P-channel type. The transistor 50 is a low-threshold voltage, N-channel type. Transistor 48 should become conductive and transistor 50 non-conductive when the gate-to-source threshold voltage becomes more Q negative than nominally $-\frac{2}{3}$ V volts. The transistor 50 should become conductive and transistor 48 non-conductive when the gate-to-source threshold voltage becomes more positive than nominally $-\frac{1}{3}$ V volts.

The third inverter branch 20 receives the basic input signal on input terminal 12 and produces a third inverted output signal on terminal 52, which serves as another switching signal to be hereinafter described. The voltage transfer function of the third inverter branch 20 is shown in FIG. 6B. It can be seen that the output signal will have a transition between +V and −V when the input voltage rises through the −V/2 level. FIG. 6C illustrates the truth table corresponding to the voltage transfer function of FIG. 6B.

The operation of the trinary inverter circuit 10 of FIG. 1 is next described.

In the case where the input voltage is in the range of nominally −V/3 to +V/3, the output signal of the first inverter branch 16 is nominally indeterminate in a range of high device output impedance. Therefore, the second and third inverter branches 18 and 20 are cooperative to maintain the output signal on terminal 14 at the mid point, or logical zero, level. More specifically, in this range the output signal of the second inverter branch 18 is logically positive at +V. This signal applied to the gate of a transistor switch 26 causes it to become conductive. Also, the output signal from the third inverter branch 20 is logically negative at −V. This signal applied to the gate of transistor switch 28 likewise causes it to conductive. The transistor switches 26 and are connected in series between the output terminal 14 and a ground terminal 30. Consequently, the signal value appearing at the output terminal 14 when the input signal on terminal 12 is in the range of nominally −V/3 to +V/3 volts is a logical zero (ground voltage).

In the case where the input signal is more negative than nominally −2V/3, the output signal from the first inverter branch 16 is logically positive at +V, as seen in FIGS. 4B and 4C. This output signal is applied directly to the output terminal 14 and represents the output of the trinary inverter The output signal from the second inverter branch 18 is similarly at +V, causing transistor 26 to become conductive. The output signal from the third inverter branch 20 is likewise logically positive. However, the application of the positive output signal to the gate of transistor switch 28 does not cause it to become conductive.

In the case where the input signal applied on terminal 12 is more positive than nominally +2V/3, the output signal from the first inverter branch 16 is logically negative at volts, and is applied directly to the output terminal 14. The output signal taken from the second inverter branch 18 is also logically negative at −V volts. The application of this output signal to the gate of transistor switch 26 causes it to be nonconductive.

In summary, the trinary inverter 10 of the present invention utilizes CMOS transistors to realize a signal inverter which experiences relatively low power dissipation in any of its three quiescence states. Moreover, the device displays low output impedance when the input signal is in the mid point range.

The embodiments of the invention for which an exclusive property or privilege is claimed as defined as follows:

1. A trinary inverter for use in inverting signals in a logic circuit having relatively positive (+V), negative (−V), and zero logic signal voltage values, comprising:
   an input terminal for receiving an input signal;
   an output terminal for providing an output signal;
   a reference terminal at the zero signal value;
   first inverter branch means, connected to the input terminal and responsive to the input signal, for inverting the input signal into the output signal and applying it to the output terminal when the input signal is outside the range of nominally −2V/3 to +2V/3 voltage values;
   second inverter branch means, connected to the input terminal and responsive to the input signal, for producing a switching signal which transitions from +V to −V when the input signal rises through +V/2;
   third inverter branch means, connected to the input terminal and responsive to the input signal, for producing another switching signal which transitions from +V to −V when the input signal rises through −V/2; and
   switch means, responsive to the switching signals and interconnecting the output terminal, the second inverter branch means, the third inverter branch means and the reference terminal, for communicating the signal value of the reference terminal to the output terminal in responses to switching signals which correspond to input signals in the range of nominally −V/3 to +V/3, and insolating the reference terminal from the output terminal in response to switching signals which correspond to input signals outside the range of nominally −2V/3 to +2V/3.

2. The trinary inverter of claim 1 wherein the switch means comprises one transistor switch which closes in response to a positive switching signal from the second inverter branch means, and another, serially-connected, transistor switch which closes in response to a negative switching signal from the third inverter branch means.

3. The trinary inverter of claim 2 where the first-mentioned transistor switch is a N-channel type, and the second-mentioned transistor switch is a P-channel type.

4. The trinary inverter of claim 1 wherein each of the branch inverter means comprise complementary MOS elements.

5. The trinary inverter of claim 1 wherein the first inverter branch means includes an inverter formed of complementary HP and HN transistors.

6. The trinary inverter of claim 1 wherein the second inverter branch means includes an inverter formed of complementary LP and HN transistors.

7. The trinary inverter of claim 1 wherein the third inverter branch includes an inverter formed of complementary HP and LN transistors.

* * * * *

UNITED STATES PATENT AND TRADEMARK OFFICE
CERTIFICATE OF CORRECTION

PATENT NO. : 4,808,854
DATED : February 28, 1989
INVENTOR(S) : Frederick G. Reinagel It is certified that error appears in the above-identified patent and that said Letters Patent is hereby corrected as shown below:

Column 1, line 27, after the word "of" insert -- CMOS --
Column 1, line 55, after the word "voltage" insert -- transfer --
Column 3, line 11, after the fraction "1/3" insert -- V --
Column 3, line 22, after the word "about" insert -- + --
Column 3, line 35, after the word "more" delete the letter --Q--
Column 3, line 65, after the word "to" insert the word
    -- become --
Column 3, line 65, after the word "and" insert -- 28 --
Column 4, line 9, after the word "inverter" insert -- 10.--
Column 4, line 18, after the word "at" insert -- -V --

Column 4, line 59, change "responses" to -- response --.

Signed and Sealed this

Twenty-second Day of August, 1989

Attest:

DONALD J. QUIGG

Attesting Officer

Commissioner of Patents and Trademarks